(12) United States Patent
Yoshida et al.

(10) Patent No.: US 7,671,710 B2
(45) Date of Patent: Mar. 2, 2010

(54) MEMS OSCILLATOR WITH TEMPERATURE SENSITIVE MEMS CAPACITANCES

(75) Inventors: Yoshifumi Yoshida, Chiba (JP); Fumio Kimura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 79 days.

(21) Appl. No.: 12/037,634

(22) Filed: Feb. 26, 2008

(65) Prior Publication Data
US 2008/0204153 A1    Aug. 28, 2008

(30) Foreign Application Priority Data
Feb. 26, 2007    (JP)    ............................... 2007-045008

(51) Int. Cl.
*H03J 1/00* (2006.01)
*H03B 5/30* (2006.01)

(52) U.S. Cl. ............................ 334/6; 331/66; 331/176; 331/116 M; 331/154

(58) Field of Classification Search ................. 331/176, 331/177 R, 66, 18, 116 R, 116 M, 154, 156, 331/158; 334/5, 6, 46, 14, 81, 80, 82; 333/186, 333/197, 200, 24 C, 234
See application file for complete search history.

(56) References Cited

U.S. PATENT DOCUMENTS

| 3,289,055 | A  | * | 11/1966 | Aizawa et al. | ............... 361/282 |
| 5,959,516 | A  | * | 9/1999 | Chang et al. | ................... 334/14 |
| 6,355,534 | B1 | * | 3/2002 | Cheng et al. | ................. 438/379 |
| 6,593,831 | B2 | * | 7/2003 | Nguyen | ....................... 333/133 |
| 2002/0069701 | A1 | | 6/2002 | Hsu et al. | |
| 2003/0058057 | A1 | * | 3/2003 | Schmidt | ...................... 331/175 |
| 2006/0033594 | A1 | | 2/2006 | Lutz et al. | |

* cited by examiner

*Primary Examiner*—Robert Pascal
*Assistant Examiner*—Ryan J Johnson
(74) *Attorney, Agent, or Firm*—Brinks Hofer Gilson & Lione

(57) ABSTRACT

Provided is an oscillator including: a MEMS resonator for mechanically vibrating; an output oscillator circuit for oscillating at a resonance frequency of the MEMS resonator to output an oscillation signal; and a MEMS capacitor for changing a capacitance thereof caused by a change in a distance between an anode electrode and a cathode beam according to an environmental temperature.

6 Claims, 9 Drawing Sheets

MEMS OSCILLATOR WITH TEMPERATURE SENSITIVE MEMS CAPACITANCES

REFERENCE TO THE RELATED APPLICATIONS

This application claims priority under 35 U.S.C. §119 to Japanese Patent application No. JP2007-045008 filed Feb. 26, 2007, the entire content of which is hereby incorporated by reference.

BACKGROUND OF THE INVENTION

1. Field of the Invention

The present invention relates to an oscillator using a MEMS technology.

2. Description of the Related Art

Under the increasing demand for reduction in size and increase in accuracy of electronic devices such as personal computers and wireless mobile devices represented by cellular phones, a small and stable high frequency signal source is inevitable in these electronic devices. A crystal resonator is a representative electronic part that satisfies the demand. It is known that the crystal resonator has an extremely high resonance sharpness (that is, Q value) which is an index of the oscillation device quality, and which exceeds 10,000 owing to the excellent crystal stability. This is a reason that the crystal resonator is widely used as a stable high frequency signal source of the wireless mobile devices, the personal computers, or the like. However, it has been also proved that the crystal resonator cannot sufficiently satisfy a recent demand for further downsizing of the electronic devices.

Under the above circumstances, in recent years, there has been reported a MEMS oscillator using, instead of a crystal resonator, a downsized MEMS resonator that is formed with technology for micro electro mechanical system (MEMS) using a silicon substrate (refer to US 2006/0033594 A1). A MEMS oscillator can be made smaller in size than the crystal oscillator, and can also operate in high frequency. Accordingly, MEMS resonators are expected to spread particularly into compact devices such as a cellular phone. Also, it is possible to integrate a MEMS resonator and a peripheral circuit into a single chip since the MEMS resonator can be manufactured from a silicon substrate.

FIG. 9 is a principle diagram showing a MEMS resonator. As shown in the figure, the MEMS resonator is disposed opposite to a substrate 10 at a distance of a gap 14 in a floating state to form an oscillation beam 11. Both ends of the oscillation beam 11 are fixed to the substrate 10 through anchors 16. A drive electrode 12 and a sense electrode 13 are disposed opposite to each other with capacitive gaps 15 with respect to the oscillation beam 11, respectively. Since the MEMS resonator is driven with an electrostatic force generated by applied voltage, in which application of a DC bias voltage in addition to an AC signal can draw the same electric characteristics (for example, a Q value) as that of a crystal resonator, it is possible to use a MEMS resonator as a resonator of a oscillator with the same configuration as that of the crystal oscillator. The oscillation frequency f0 of the MEMS resonator can be represented by using an effective mass Meff and an effective hardness Keff as follows.

$$f0 = 1/(2\pi)\sqrt{(Keff/Meff)}$$

Since material of the oscillation beam 11 expands and contracts according to the environmental temperature, the effective mass Meff changes. And since the Young's modulus of the material for the oscillation beam 11 changes according to the environmental temperature, the effective hardness Keff also changes.

In the MEMS oscillator according to the above conventional art, however, there arises such a problem that the temperature dependency of the oscillation frequency is worse than that of a crystal resonator. This is because the effective mass and the effective hardness change according to the temperature. To correct the temperature dependency a temperature sensor is required though, there arise such problems that the size of the oscillator becomes large, and the cost also increases when a temperature sensor is incorporated separately into the oscillator. Disposition of the temperature sensor at a position apart from the resonator arises another problem that a error in the temperature detection becomes so large that deteriorates accuracy of correction.

SUMMARY OF THE INVENTION

The present invention has been made in view of the above-mentioned circumstances, and it is therefore an object of the present invention to provide an oscillator using a MEMS resonator, which automatically corrects the temperature dependency of the frequency by using the temperature dependency of the MEMS capacitor.

An oscillator according to the present invention includes: an output oscillator circuit for oscillating at a resonance frequency of an output resonator to transmit an oscillation signal; and a capacitor changing a capacitance caused by a change in a distance between an anode electrode and a cathode beam according to an environmental temperature.

Further, an output resonator according to the present invention is disposed opposite to a support layer which is a semiconductor substrate, and at least a part of the output resonator is fixed to an insulating layer on the support layer.

Further, the capacitor according to the present invention includes: a support beam and a cathode beam disposed opposite to a support layer which is the semiconductor substrate with a gap; an anchor for fixing the support beam onto the support layer which is the semiconductor substrate; and an anode electrode fixed onto the support layer which is the semiconductor substrate, in which both ends of the cathode beam are connected to one end of the support beam, respectively, another end of the support beam is fixed to an insulating film on the support layer which is the semiconductor substrate through the anchor, and the anode electrode and the cathode beam are disposed opposite to each other in parallel, and the support beam is connected orthogonally to the cathode beam.

Also, according to the present invention, the capacitor includes support beams that are disposed opposite to the support layer which is the semiconductor substrate with a gap, an anode electrode, a cathode electrode, and anchors that fix the support beams on the support layer which is the semiconductor substrate, in which one end of one of the support beams is connected to the cathode electrode, another end of the one support beam is fixed onto an insulating layer on the support layer that is the semiconductor substrate through one anchor, one end of another support beam is connected to the anode electrode, another end of the another support beam is connected to the insulating film on the support layer that is the semiconductor substrate through another anchor, the anode electrode and the cathode electrode are disposed opposite to each other in parallel, the support beam that is connected with the anode electrode and the support beam that is connected with the cathode electrode are disposed in parallel to each other, and the respective anchors thereof are disposed at positions completely opposite to each other.

Further, according to the present invention, the oscillator is designed in such a manner that the output resonator, the output oscillator circuit, and the capacitor are formed on the same substrate.

According to the present invention, the capacitor that is connected to the output oscillator circuit is designed so as to change the capacitance with respect to the temperature. As a result, it is possible to provide an oscillator which shows little change in the frequency with respect to the temperature and which automatically corrects the change in oscillation frequency of the oscillator caused by the environmental temperature. Also, since the capacitor is located adjacent to the MEMS resonator and manufactured in the same process as that of the MEMS resonator, it is possible to correct the oscillation frequency of the oscillator by precisely detecting the temperature of the MEMS resonator. Further, providing a quadratic characteristic to a change in capacitance of the capacitor with respect to the temperature, it is possible to provide the oscillator that automatically corrects the quadratic component of the frequency temperature change of the oscillator and that shows little change in the frequency with respect to the temperature. Still further, since the MEMS resonator, the capacitor, and the output oscillator circuit can be fabricated on the same substrate through the same process, it is possible to provide the oscillator using the MEMS resonator which is small in size and inexpensive.

DETAILED DESCRIPTION OF THE PREFERRED EMBODIMENTS

First Embodiment

Hereinafter, a description will be given of an embodiment of the present invention with reference to the accompanying drawings.

Figure 1:
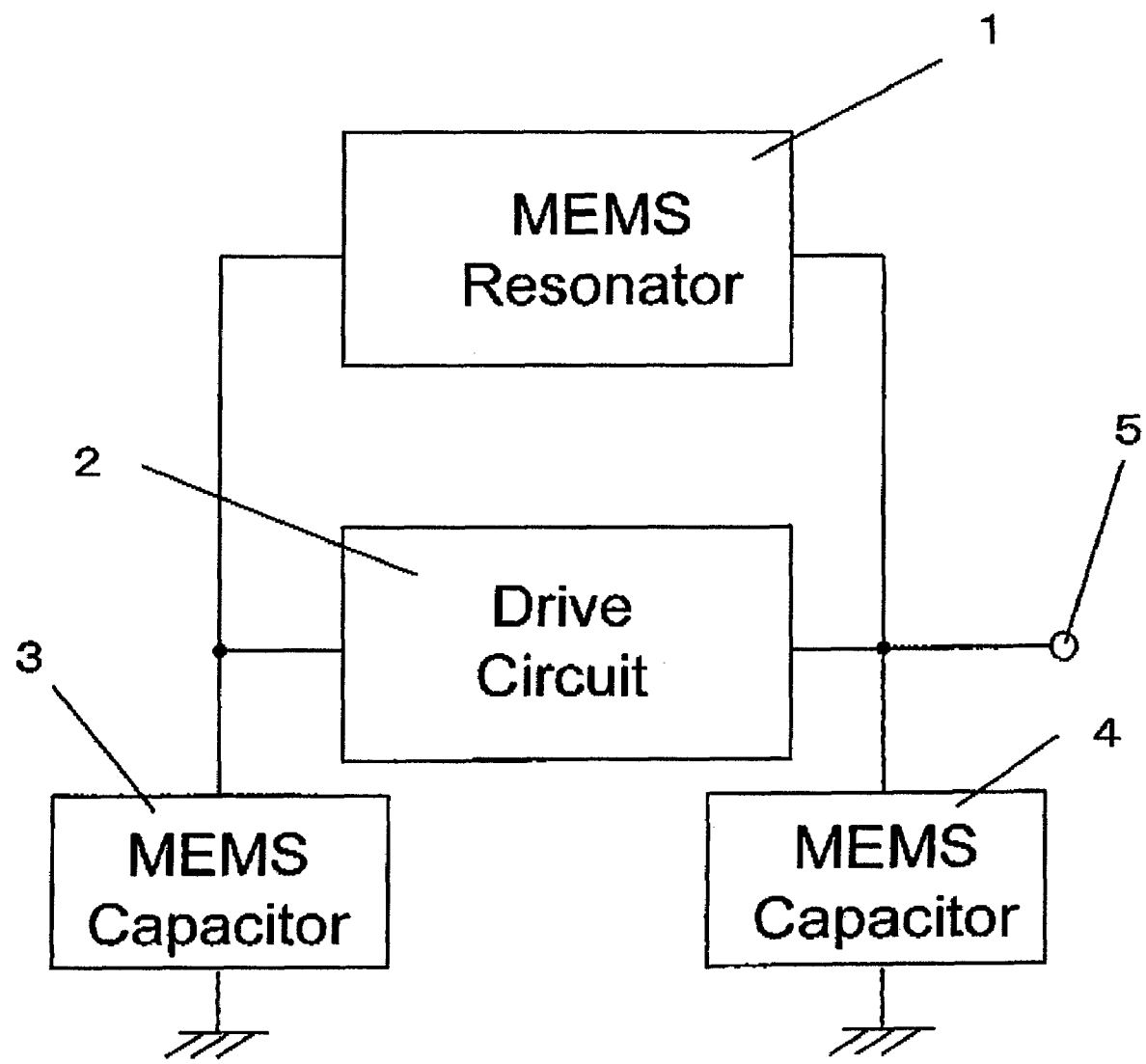
FIG. 1 is a block diagram showing an oscillator according to an embodiment of the present invention.
Figure 2:
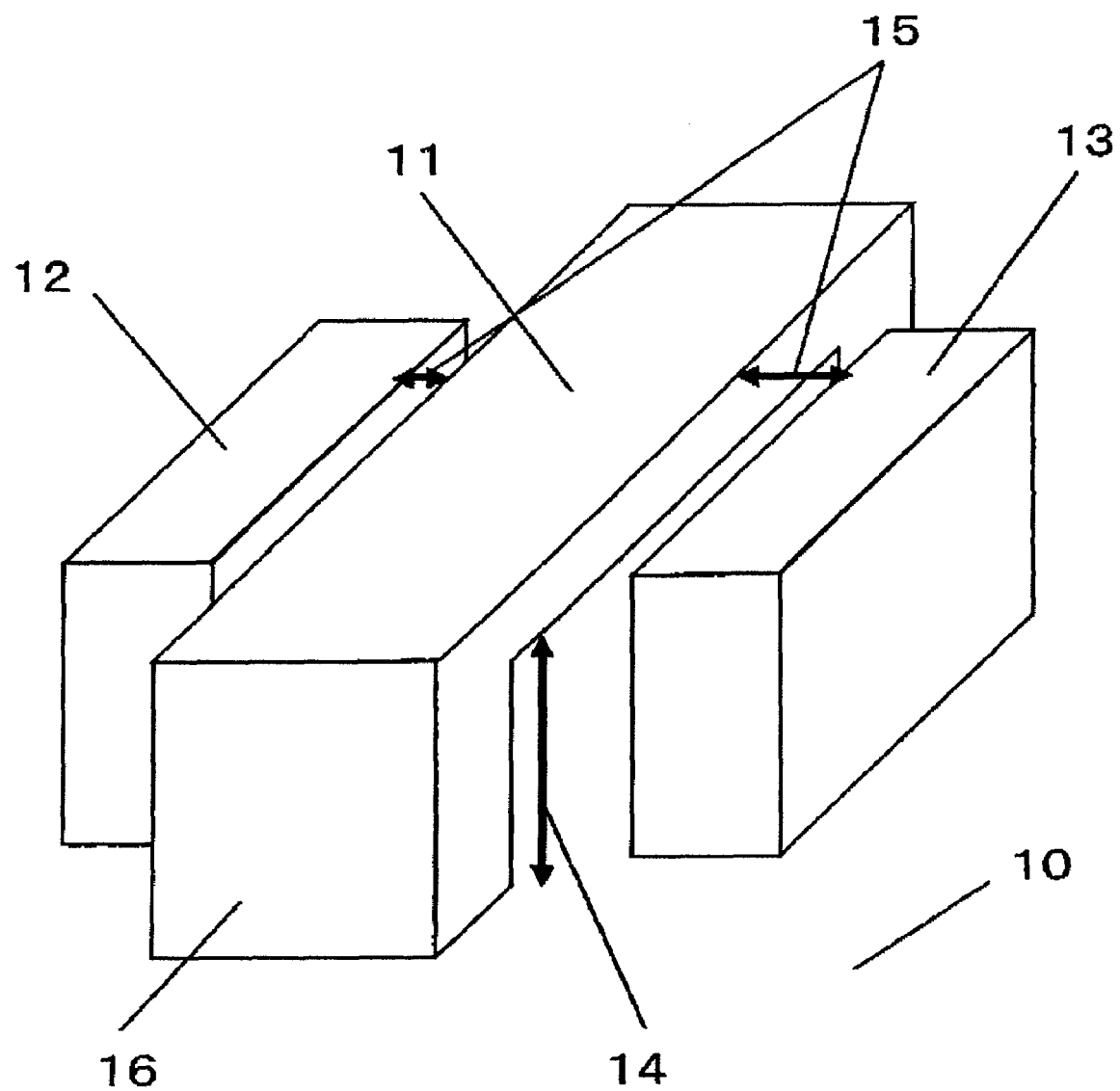
FIG. 2 is a perspective view showing a configuration of a MEMS resonator according to the embodiment of the present invention.
Figure 3:
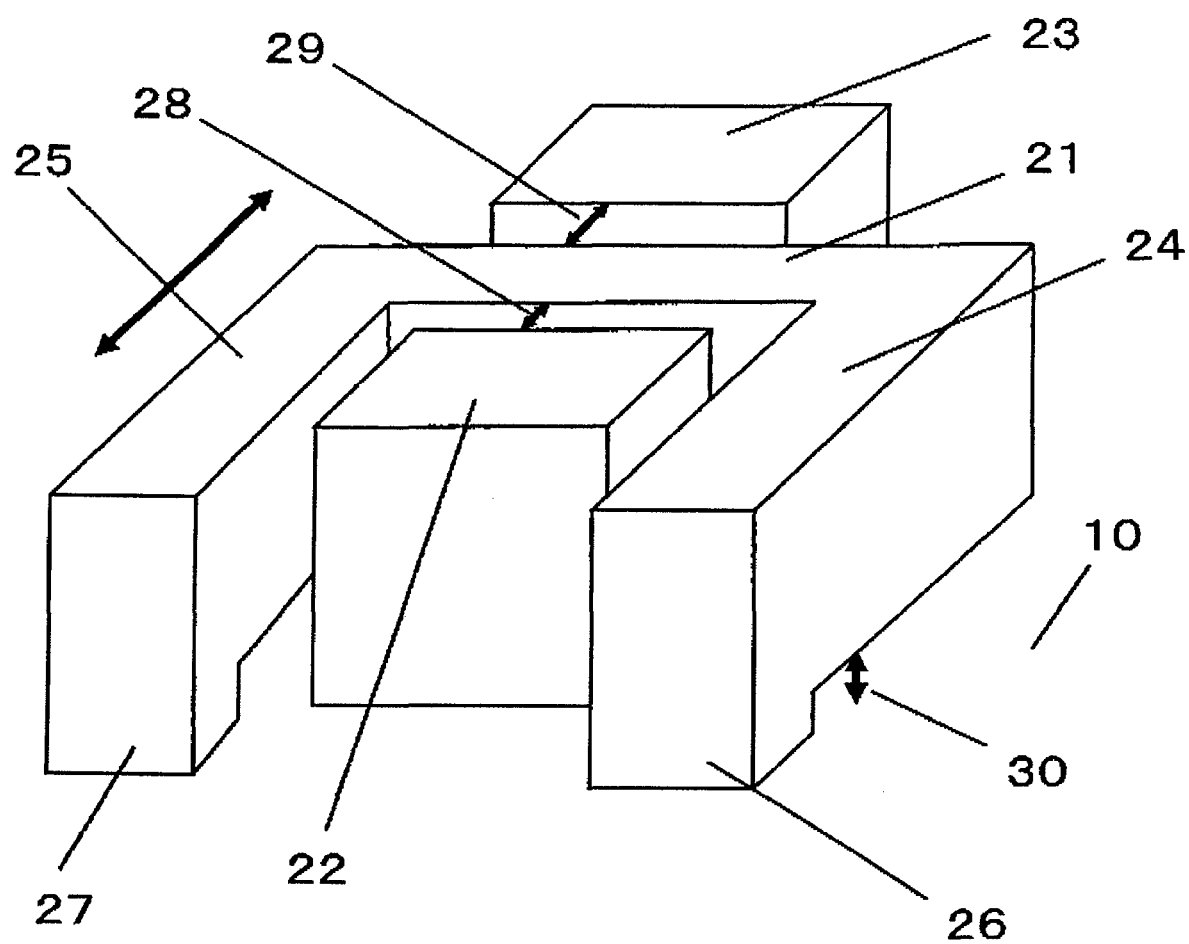
FIG. 3 is a perspective view showing a configuration of a MEMS capacitor according to the embodiment of the present invention.

FIG. 1 is a block diagram showing an oscillator according to an embodiment of the present invention. As shown in the figure, the oscillator includes a MEMS resonator 1, an output oscillator circuit 2, and MEMS capacitors 3 and 4. Also, as shown in FIG. 2, the MEMS resonator 1 includes an oscillation beam 11, a drive electrode 12, and a sense electrode 13. The sense electrode 13 of the MEMS resonator 1 is connected to the MEMS capacitor 3 and an input terminal of the output oscillator circuit 2. The drive electrode 12 of the MEMS resonator 1 is connected to the MEMS capacitor 4, an output terminal of the output oscillator circuit 2, and an output terminal 5 of the oscillator.

The block diagram of the oscillator shown in FIG. 1 is constructed based on a Pierce-type oscillator circuit, but is not necessarily limited to this configuration. The feature of the present invention resides in that the MEMS capacitor is used in the output oscillator circuit of the MEMS resonator, which can be applied to other amplifier circuits or oscillator circuits.

As shown in FIG. 2, the MEMS resonator 1 of FIG. 1 includes an anchor 16, the drive electrode 12, and the sense electrode 13 disposed on a substrate 10 through an insulating layer. No insulating layer exists between the oscillation beam 11 and the substrate 10, and a gap 14 is formed therebetween. With the above configuration, the oscillation beam 11 can mechanically vibrate. In addition, both ends of the oscillation beam 11 in the longitudinal direction are fixed to the insulating layer on the substrate 10 by means of the anchors 16. The drive electrode 12 and the sense electrode 13 are 3 and 4 are formed by using a silicon insulator (SOI) substrate by the MEMS technology. The SOI substrate has an active layer, the insulating layer, and the substrate 10. Among those layers, the active layer (silicon) is used in order to form the oscillation beam 11 of the MEMS oscillator, the support beams 24, 25, 33, and 34 of the MEMS capacitor, the cathode electrodes 21 and 31, and the anode electrode 32. Those movable portions are formed so as to be disposed opposite to the substrate 10 and adjacent to each other by etching. In order that those movable portions function as electrodes, the active layer is made low in the resistance due to impurity doping in advance.

The insulating layer other than the insulating layer under the anchors 16, 26, 27, 35, and 36 is also removed by etching after the active layer has been processed, to thereby form gaps between the above movable portions and the substrate. The insulating layer under the anchors 16, 26, 27, 35, and 36 which remains without being etched electrically insulates the substrate 10 from the movable portions, and is also fixed to the substrate 10.

Further, the respective electrodes are electrically connected to the oscillator circuit by vapor deposition of aluminum (Al), or the like.

The MEMS resonator 1 and the MEMS capacitors 3 and 4 are formed to be adjacent to each other, so it is possible to detect substantially the same temperature as that of the oscillation beam 11. Also, because the MEMS resonator 1 and the MEMS capacitor can be formed integrally through the same process, it is possible to remarkably downsize the oscillator and reduce the costs.

Next, the operation of the oscillator according to this embodiment will be described in detail.

First, a beam bias voltage is applied to the oscillation beam 11 of the MEMS resonator 1 through the anchor 16. The output oscillator circuit 2 oscillates at the resonance frequency that is determined according to the MEMS resonator 1 and the MEMS capacitors 3 and 4, and outputs an output oscillation signal. The output signal is transmitted to another circuit through the output terminal 5, and also transmitted to the drive electrode 12 of the MEMS resonator 1. An AC voltage as well as a DC bias voltage is applied to the drive electrode 12, thereby making it possible to provide the same characteristics (for example, a Q value) as that of the crystal resonator.

Figure 7:
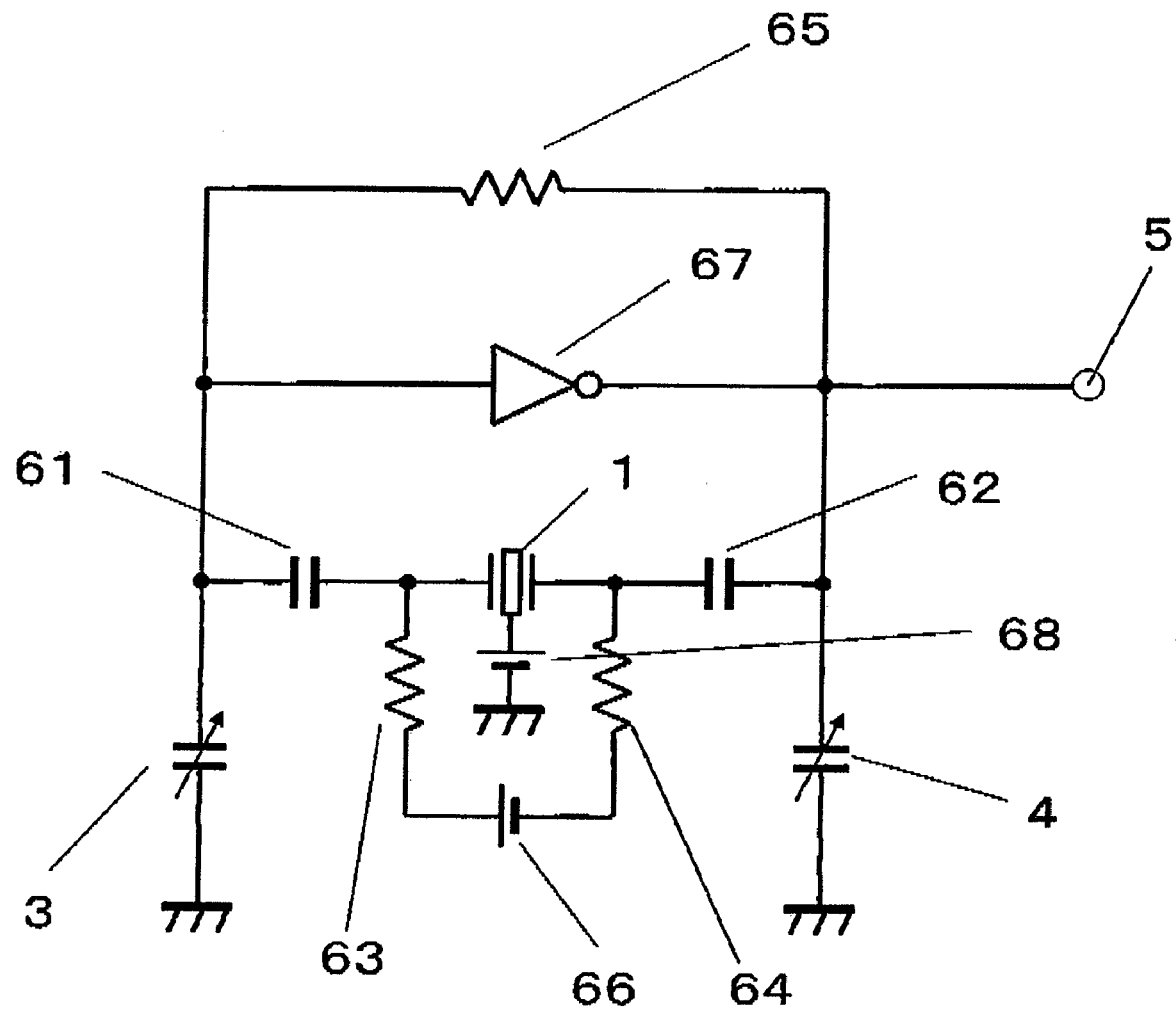
FIG. 7 is a circuit diagram showing an output oscillator circuit according to an embodiment of the present invention.

Now, a description will be given of an example of the output oscillator circuit according to the embodiment of the present invention with reference to FIG. 7.

Both ends of the MEMS resonator 1 are connected to one ends of current suppression resistors 63 and 64, respectively. Another ends of the current suppression resistors 63 and 64 are connected to both ends of the DC bias voltage 66, respectively. Also, both ends of the MEMS resonator 1 are connected with one ends of DC component cut capacitors 61 and 62, respectively. Further, the oscillation beam 11 of the MEMS resonator 1 is connected to a positive pole of a beam bias voltage 68, and a negative pole thereof is grounded. Another end of the DC component cut capacitor 61 is connected with one end of the MEMS capacitor 3 that is a load capacity as well as an input terminal of an inverter (amplifier) 67 and one end of a load resistor 65. Also, another end of the DC component cut capacitor 62 is connected with one end of the MEMS capacitor 4 that is the load capacity as well as an output terminal of the inverter 67, another end of the load resistor 65, and the output terminal 5 of the output oscillator circuit 2. Another ends of the MEMS capacitors 3 and 4 that are the load capacitors are grounded, respectively.

Next, the operation of the oscillator circuit of this embodiment will be described.

As described above, the DC bias voltage 66 and the beam bias voltage 68 are applied to both ends of the MEMS resonator 1 to further increase an electrostatic attraction between the oscillation beam 11 and the drive electrode 12, and between the oscillation beam 11 and the sense electrode 13, and also adjust the level of the signal that is input to the input terminal of the inverter (amplifier) 67. In this case, because the DC bias voltage 66 is applied, the current suppression resistors 63 and 64 are inserted for the purpose of preventing the inflow and outflow of a large current with respect to the MEMS resonator 1. Also, the DC component cut capacitors 61 and 62 are inserted so that no DC voltage is applied to an input/output terminal of the inverter (amplifier) 67.

The oscillation beam 11 then induces the electrostatic attraction due to the AC voltage that has been added to the drive electrode 12 and the DC bias voltage that has been added to the oscillation beam 11, and oscillates. Electric charges are induced in the sense electrode 13 due to the oscillation of the oscillation beam 11, and an increase or decrease in the induced electric charges is transmitted to the input terminal of the inverter (amplifier) 67 as a signal. The signal that has been transmitted to the input terminal is amplified by the inverter (amplifier) 67, and again added to the drive electrode 12.

Repeating the above operation, the output oscillator circuit 2 finally oscillates at the resonance frequency of the MEMS resonator 1 and outputs an oscillation signal.

Figure 8:
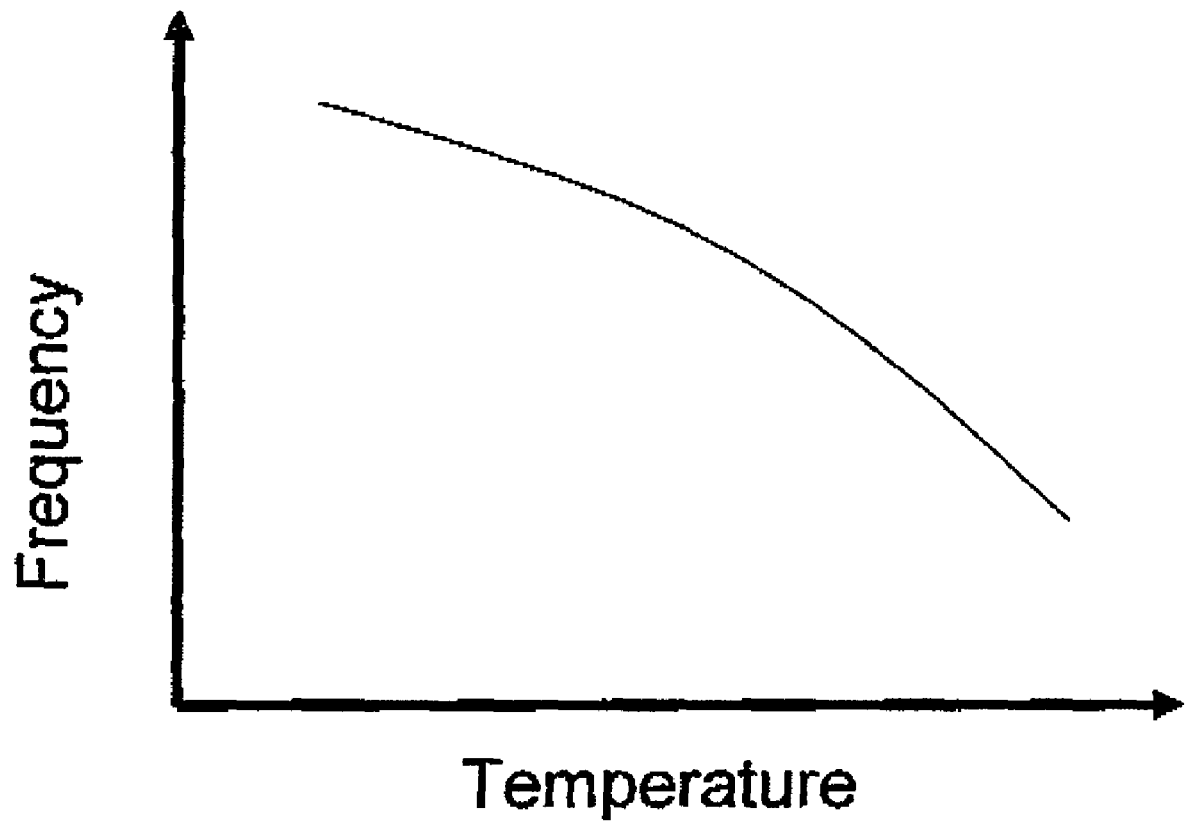
FIG. 8 is a graph showing temperature dependency of the resonance frequency of the MEMS resonator according to the embodiment of the present invention.
Figure 9:
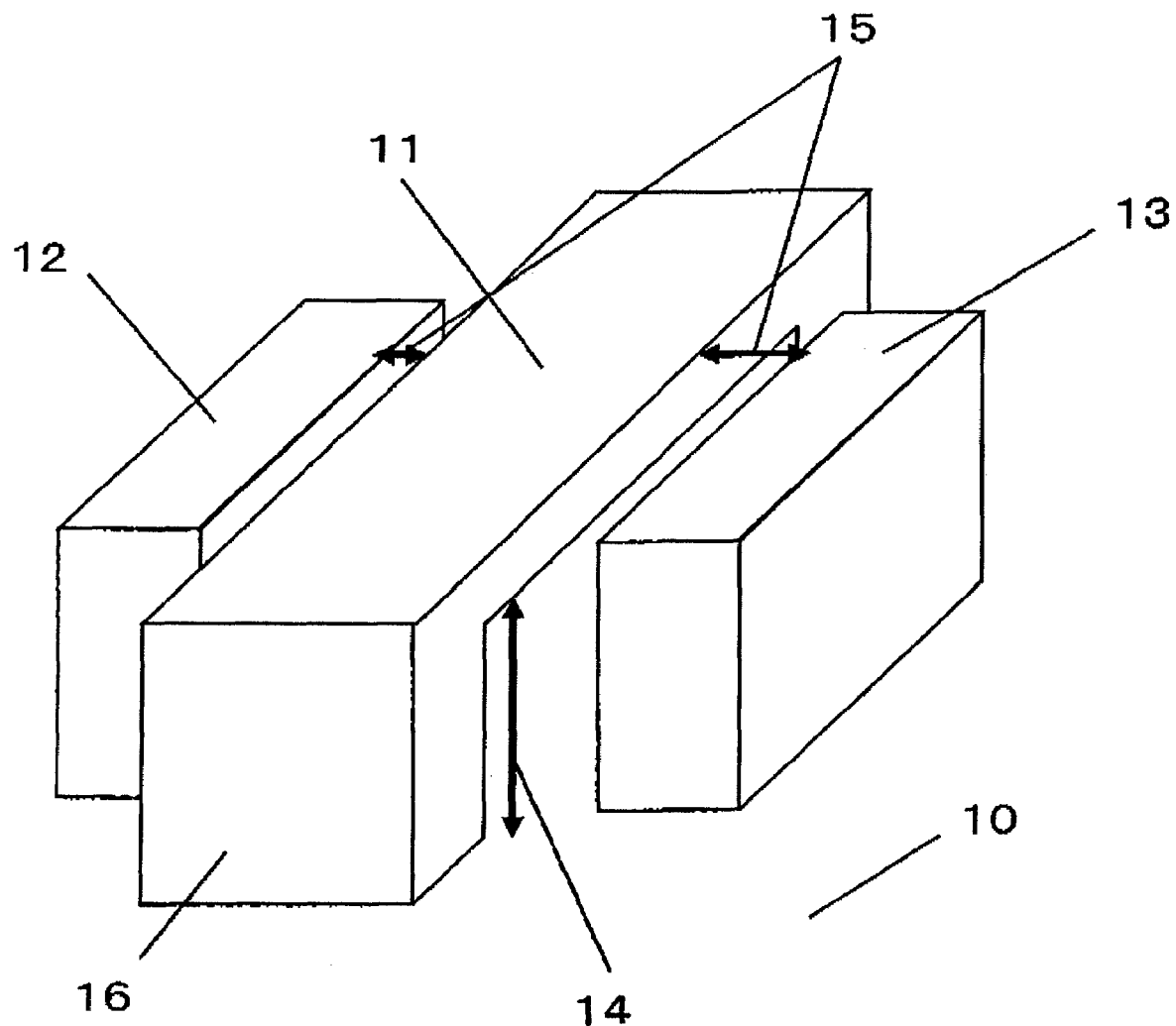
FIG. 9 is a perspective view showing a principle configuration of a MEMS resonator.

FIG. 8 shows a temperature dependency of a resonance frequency of the MEMS resonator. As shown in the figure, the resonance frequency of the MEMS resonator is lower when the temperature is higher. Also, a relationship between the temperature and the frequency is not linear but is quadratically lowered. For that reason, a manner that a temperature sensor is disposed to measure the temperature of the MEMS resonator and correct the frequency by the circuit as in the conventional art suffers from severe difficulties.

The MEMS capacitors 3 and 4 that are connected to the input terminal and the output terminal of the output oscillator circuit 2 are disposed to provide capacitive gaps 20 between the anode electrodes 22 and 23 and the cathode electrode 21. The MEMS capacitors 3 and 4 have therefore the capacitance determined by the following expression.

$$C = \epsilon S/d \text{ ($S$ is an anode electrode area, and $d$ is a capacitive gap)}$$

When the environmental temperature changes, the material is expanded or contracted based on the following arithmetic expression.

$$L' = L_0(1 + \alpha \Delta T + \beta \Delta T^2)$$

$L_0$ is a length of the material at a reference temperature, $L'$ is a length of the material at the present environmental temperature, $\Delta T$ is a temperature difference between the reference temperature and the present environmental temperature, and $\alpha$ and $\beta$ are linear expansion temperature coefficients of the material.

Figure 4A:
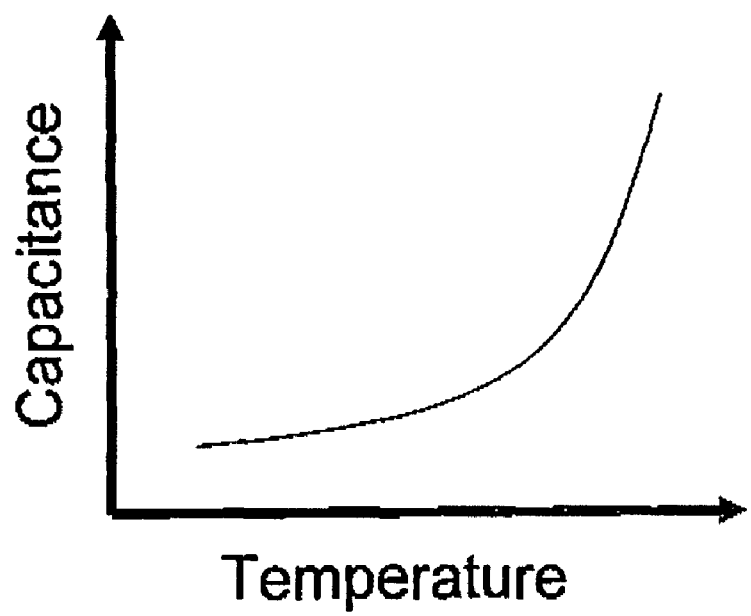
FIGS. 4A and 4B are graphs showing temperature dependency of the capacitance of the MEMS capacitor according to the embodiment of the present invention.
Figure 4B:
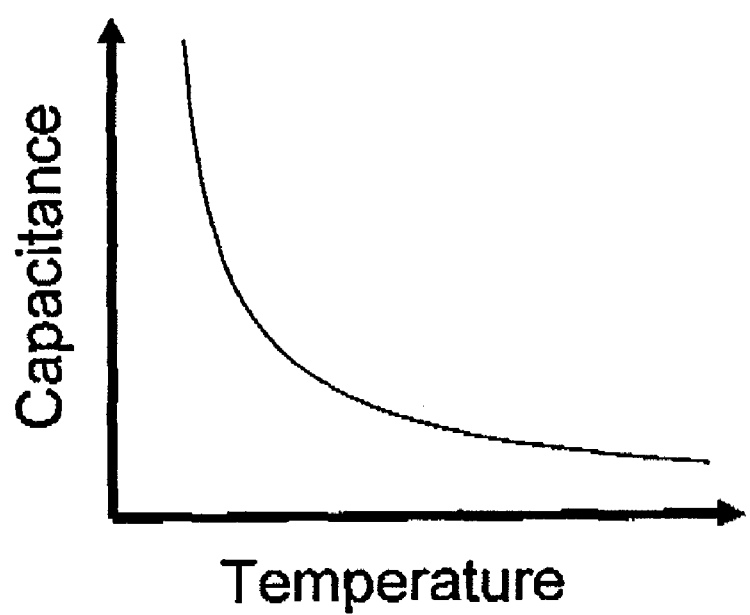

Thus, when the environmental temperature is, for example, higher than the reference temperature, the lengths of the support beams 24 and 25 expand based on the above arithmetic expression. However, because one ends of the support beams 24 and 25 are fixed to the substrate 10 by means of the anchors 26 and 27, the support beams 24 and 25 expand to a direction connected by the cathode electrode 21 (to a direction opposite to the ends that are fixed by the anchors 26 and 27). And because the anode electrodes 22 and 23 are fixed to the substrate 10, the capacitive gap 29 between the anode electrode 23 and the cathode electrode 21 reduces, and the capacitive gap 28 between the anode electrode 22 and the cathode electrode 21 expands. Accordingly, when the anode electrode 23 and the cathode electrode 21 are used to constitute the MEMS capacitors 3 and 4, the capacitance values of the MEMS capacitors 3 and 4 increase when the environmental temperature rises (FIG. 4A). On the other hand, when the anode electrode 22 and the cathode electrode 21 are used to constitute the MEMS capacitors 3 and 4, the capacitance values of the MEMS capacitors 3 and 4 decrease when the environmental temperature rises (FIG. 4B). When the MEMS capacitor is used in the circuit block of FIG. 1, the temperature dependency of the frequency of the MEMS resonator 1 shows that temperature rising causes frequency lowering. As a result, the anode electrode 22 and the cathode electrode 21 are used to constitute the MEMS capacitors 3 and 4 so that the capacitance of the capacitor becomes lower when the temperature rises. The combination of the MEMS resonator 1 and the MEMS capacitor is not necessarily limited to the use of the anode electrode 22 and the cathode electrode 21. Selection of anode electrode to be connected depends on the circuit configuration of the output oscillator circuit 2. In the oscillator circuit of the Pierce type described in the present invention, the anode electrode 22 and the cathode electrode 21 are used as described above.

When the environmental temperature becomes higher, the capacitance values of the MEMS capacitors 3 and 4 tend to be low and the frequency of the output signal of the output oscillator circuit 2 tends to increase. On the other hand, the resonance frequency of the MEMS resonator 1 tends to be low when the temperature rises. As a result, the resonance frequency of the combined MEMS resonator 1 and MEMS capacitors 3 and 4 can be held constant without changing with respect to the temperature.

As described above, the oscillator according to this embodiment compensates the frequency of the MEMS resonator with the temperature by using the temperature dependency of capacitance of the MEMS capacitor.

Second Embodiment

An oscillator according to another embodiment of the present invention will be described in detail.

In the frequency temperature characteristic of the MEMS resonator 1, as shown in FIG. 8, the resonance frequency of the MEMS resonator decreases when the temperature rises. Also, a relationship between the temperature and the frequency is not linear but is quadratic. Up to now, in order to improve the frequency temperature characteristic of the MEMS resonator, there have been used the methods disclosed in UP 2006/0033594 A1 and US 2002/0069701 A1. In those methods, the linear component of the frequency temperature characteristic is reduced, but the effect of reducing the quadratic component of the temperature characteristic is small. Under the circumstances, in another embodiment of the present invention, the capacitance values of the MEMS capacitors 3 and 4 which are connected to the input/output terminals of the output oscillator circuit 2 show quadratic change due to temperature to reduce the quadratic component of the frequency temperature characteristic.

Figure 5:
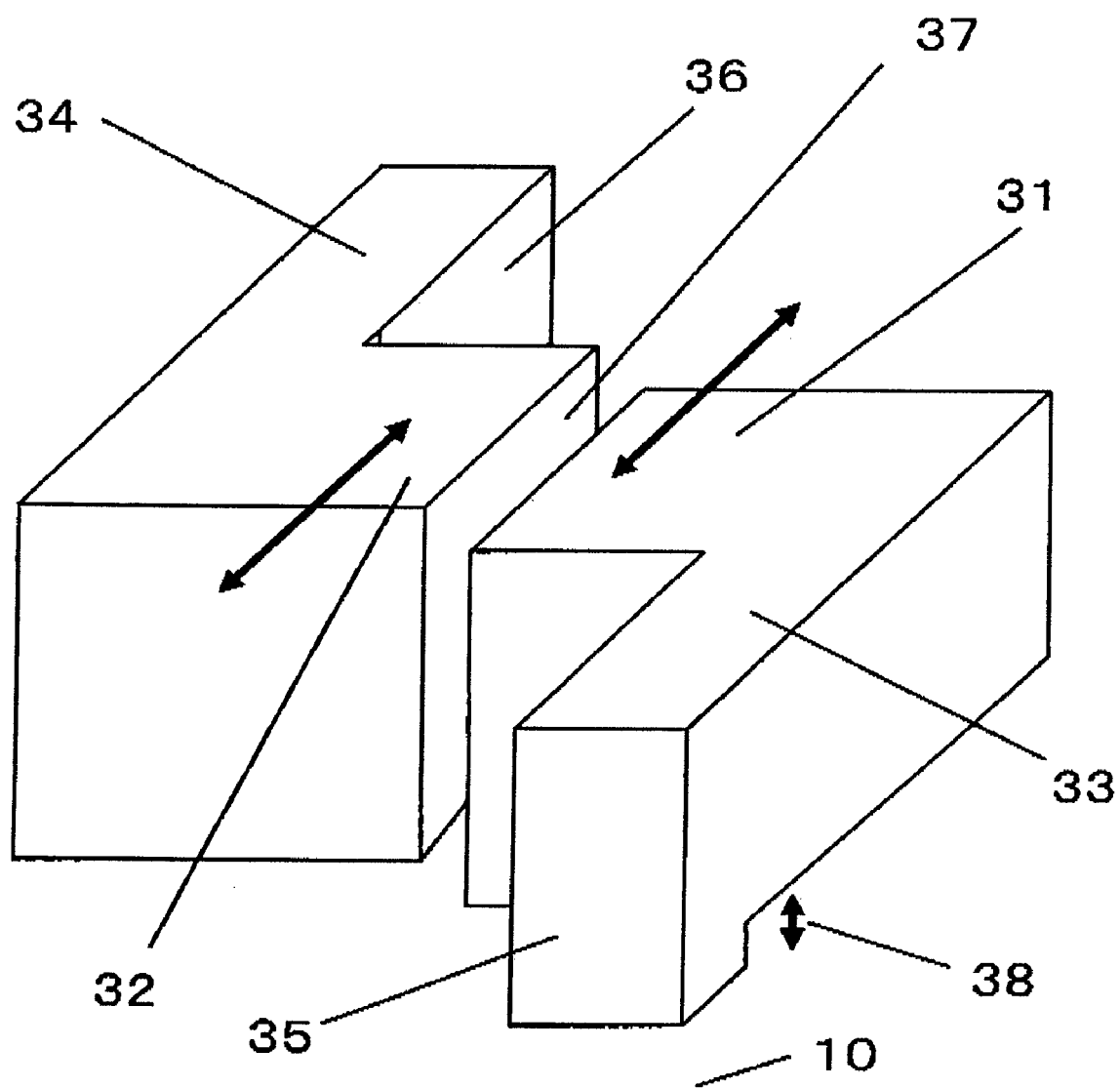
FIG. 5 is a perspective view showing a configuration of a MEMS capacitor according to another embodiment of the present invention.

As shown in FIG. 5, the MEMS capacitors 3 and 4 of FIG. 1 include the cathode electrode 31, the anode electrode 32, the support beams 33 and 34, and the anchors 35 and 36. The cathode electrode 31, the anode electrode 32, and the support beams 33 and 34 set afloat with a gap 38 with respect to the substrate 10. The cathode electrode 31 is connected to one end of the support beam 33. Another end of the support beam 33 is fixed to the insulating layer on the substrate 10 by means of the anchor 35. The anode electrode 32 is connected to one end of the support beam 34. Another end of the support beam 34 is fixed to an insulating layer on the substrate 10 by the anchor 36. The cathode electrode 31 and the anode electrode 32 are disposed with a capacitive gap 37 therebetween in such a manner that the sides of the cathode electrode 31 and the anode electrode 32 which are in parallel to the long sides of the support beams 33 and 34 are opposite to each other. Also, the support beams 33 and 34 are fixed to the insulating layer on the substrate 10 through the anchors 35 and 36, respectively. In this situation, the anchors 35 and 36 are disposed at positions completely opposite to each other with respect to a face where the cathode electrode 31 and the anode electrode 32 face each other.

Next, the operation of the oscillator according to another embodiment of the present invention will be described in detail.

First, in order to improve the frequency temperature characteristic of the MEMS resonator 1, a MEMS resonator using the methods disclosed in US 2006/003594 A1, US 2002/0069701 A1 or the like is selected. Starting point is that the linear component of the frequency temperature characteristic is substantially removed, but that the quadratic component of the temperature characteristic remarkably remains.

The MEMS capacitors 3 and 4 that are connected to the input terminal and the output terminal of the output oscillator circuit 2 are disposed to provide the capacitive gap 37 between the anode electrode 32 and the cathode electrode 31. Therefore, the MEMS capacitors 3 and 4 have the capacitance value that is determined by the following expression.

$C=\epsilon S/d$ ($S$ is a capacitor electrode area, and $d$ is a capacitive gap)

When the environmental temperature changes, the material expands and contracts based on the following arithmetic expression.

$L'=L_0(1+\alpha\Delta T+\beta T^2)$ $L_0$ is a length of the material at a reference temperature, L' is a length of the material at the present environmental temperature, $\Delta T$ is a temperature difference between the reference temperature and the present environmental temperature, and $\alpha$ and $\beta$ are linear expansion temperature coefficients of the material.

For that reason, when the environmental temperature is, for example, higher than the reference temperature, the lengths of the support beams 33 and 34 expand based on the above arithmetic expression. However, because one ends of the support beams 33 and 34 are fixed to the substrate 10 by means of the anchors 35 and 36, the support beam 33 expands to a direction connected by the cathode electrode 31 (to a direction opposite to the end that is fixed by the anchor 35), and the support beam 34 expands to a direction connected by the anode electrode 32 (to a direction opposite to the end that is fixed by the anchor 36). The capacitance of the capacitor is proportional to the area of the electrode as represented by the above expression, so the support beams 33 and 34 expand, to thereby reduce an electrode area where the anode electrode 32 and the cathode electrode 31 face each other, and reduce the capacitance value of the capacitor.

On the other hand, in the case where the environmental temperature is lower than the reference temperature, the lengths of the support beams 33 and 34 contract based on the above expression. However, because the support beams 33 and 34 have one ends fixed to the substrate 10 by means of the anchors 35 and 36, the support beam 33 contracts in a direction of the anchor 35, and the support beam 34 contracts in a direction of the anchor 36. The capacitance of the capacitor is proportional to the area of the electrode as represented by the above expression, so the support beams 33 and 34 expend, to thereby reduce an electrode area where the anode electrode 32 and the cathode electrode 31 face each other, and reduce the capacitance value of the capacitor.

Figure 6:
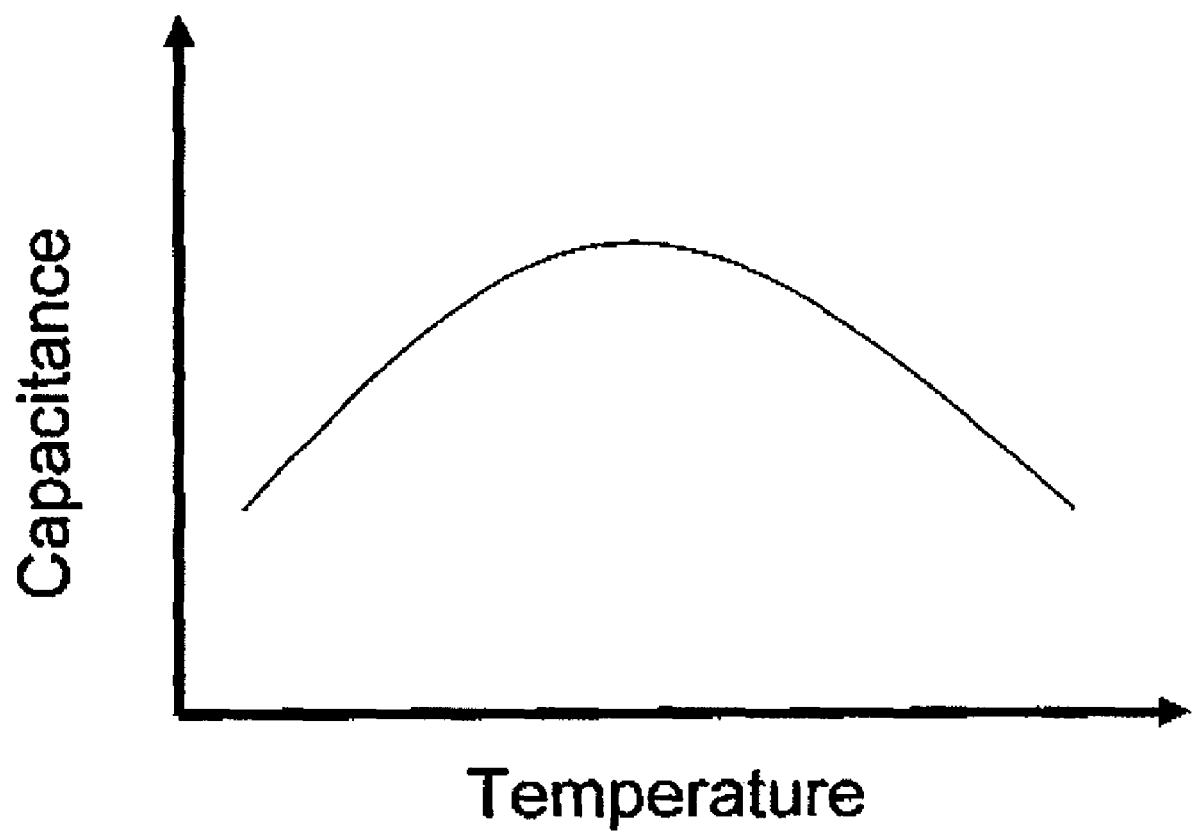
FIG. 6 is a graph showing temperature dependency of the capacitance of the MEMS capacitor according to the another embodiment of the present invention.

In other words, the capacitance of the MEMS capacitor has the quadratic characteristic where the capacitance becomes lower even if the temperature is high or low with the capacitance at the reference temperature as the maximum (refer to FIG. 6). The MEMS resonator whose linear temperature characteristic of the frequency has been corrected has a negative quadratic characteristic with a certain temperature as the maximum value. The MEMS capacitor has also the negative capacitance temperature characteristic with the certain temperature as the maximum value. Thus, the resonance frequency of the combined MEMS resonator 1 and MEMS capacitors 3 and 4 can be held constant without changing with respect to the temperature.

As described above, the oscillator according to this embodiment compensates the frequency of the MEMS resonator with the temperature by using the temperature dependency of the capacitance of the MEMS capacitor.

Further, in the case of the above configuration using an SOI substrate or the like, it is possible to integrate all of the structural elements on the same substrate together in this oscillator. Also, for example, it is possible to form another integrated circuit that processes diverse signals by using an oscillation signal of the oscillator circuit of the present invention on the same substrate.

The embodiments of the present invention have been described in detail, but specific configurations are not limited thereto, and various changes may be made without departing from the scope of the invention.

For example, the structure of the MEMS resonator is not limited to the structure shown in FIG. 2, but may be of a structure using lateral oscillation, or of a structure in which both ends of the resonator are supported. Further, it is needless to say that the configuration of the oscillator circuit is not limited to the structure shown in FIG. 7.

What is claimed is:

1. An oscillator comprising:
   an output resonator which vibrates mechanically;
   an output oscillator circuit oscillating at a resonance frequency of the output resonator to transmit an oscillation signal; and
   a capacitor which changes a capacitance thereof as a distance between an anode electrode and a cathode beam changes with environmental temperature, wherein the capacitor comprises:
   two support beams being disposed opposite with a gap to a support layer which is a semiconductor substrate; and
   two anchors for fixing one ends of the two support beams respectively onto the support layer such that two support beams extend in parallel in the same direction from the two anchors, wherein
   the other ends of the two support beams are connected orthogonally to ends of the cathode beam, respectively, and
   the anode electrode is fixed onto the support layer with the distance from the cathode beam wherein as the two support beams change their lengths with the environmental temperature, the distance between the anode electrode and the cathode beam changes to thereby change the capacitance.

2. An oscillator according to claim 1, wherein the output resonator is disposed opposite to the support layer, and at least a part of the output resonator is fixed to an insulating layer formed on the support layer.

3. An oscillator according to claim 1, wherein the output resonator, the output oscillator circuit, and the capacitor are formed on a single substrate.

4. An oscillator comprising:
   an output resonator which vibrates mechanically;
   an output oscillator circuit oscillating at a resonance frequency of the output resonator to transmit an oscillation signal; and
   a capacitor which changes a capacitance thereof as a capacitor electrode area between an anode electrode and a cathode electrode changes with environmental temperature, wherein the capacitor comprises:
   a first support beam and a second support beam which are disposed opposite with a gap to a support layer which is a semiconductor substrate, the anode electrode and the cathode electrode being connected respectively to one ends of the first and second support beams;
   a first anchor for fixing the other end of the first support beam onto the support layer; and
   a second anchor for fixing the other end of the second support beam onto the support layer,
   wherein the first support beam and the second support beam extend in parallel from the first and second anchors in the opposite directions such that the anode electrode and the cathode electrode at least partially face each other to create the capacitor electrode area between them, wherein as the first and second support beams change their lengths with the environmental temperature, the capacitor electrode area created between the anode electrode and the cathode electrode changes to thereby change the capacitance.

5. An oscillator according to claim 4, wherein the output resonator is disposed opposite to the support layer, and at least a part of the output resonator is fixed to an insulating layer formed on the support layer.

6. An oscillator according to claim 4, wherein the output resonator, the output oscillator circuit, and the capacitor are formed on a single substrate.

* * * * *